(12) United States Patent
Lu et al.

(10) Patent No.: US 11,545,600 B2
(45) Date of Patent: Jan. 3, 2023

(54) LED PACKAGE

(71) Applicant: EPISTAR CORPORATION, Hsinchu (TW)

(72) Inventors: Tsung-Hong Lu, Hsinchu (TW); Pao-Yu Liao, Hsinchu (TW); Ching-Tai Cheng, Hsinchu (TW)

(73) Assignee: EPISTAR CORPORATION, Hsinchu (TW)

( * ) Notice: Subject to any disclaimer, the term of this patent is extended or adjusted under 35 U.S.C. 154(b) by 8 days.

(21) Appl. No.: 16/846,059

(22) Filed: Apr. 10, 2020

(65) Prior Publication Data
US 2020/0328330 A1 Oct. 15, 2020

(30) Foreign Application Priority Data
Apr. 11, 2019 (TW) .................................. 108112585

(51) Int. Cl.
*H01L 33/50* (2010.01)
*H01L 33/10* (2010.01)
*H01L 33/56* (2010.01)
*H01L 33/54* (2010.01)
*H01L 33/06* (2010.01)

(52) U.S. Cl.
CPC .............. *H01L 33/505* (2013.01); *H01L 33/06* (2013.01); *H01L 33/10* (2013.01); *H01L 33/504* (2013.01); *H01L 33/54* (2013.01); *H01L 33/56* (2013.01)

(58) Field of Classification Search
CPC ....... H01L 33/505; H01L 33/06; H01L 33/10; H01L 33/504; H01L 33/54; H01L 33/56
See application file for complete search history.

(56) References Cited

U.S. PATENT DOCUMENTS

| | | | |
|---|---|---|---|
| 2015/0255505 A1* | 9/2015 | Jeoung .................. | H05K 1/189 257/89 |
| 2016/0122637 A1* | 5/2016 | Pohl-Klein .......... | H01L 33/504 252/301.4 R |
| 2017/0054061 A1* | 2/2017 | Naka ...................... | H01L 33/56 |
| 2018/0151543 A1* | 5/2018 | Lee ......................... | H01L 33/54 |
| 2020/0083198 A1* | 3/2020 | Kuo ....................... | H01L 33/505 |
| 2020/0212274 A1* | 7/2020 | Matsuda ................ | H01L 33/60 |

FOREIGN PATENT DOCUMENTS

| | | |
|---|---|---|
| TW | 201228043 A | 7/2012 |
| TW | 201238100 A | 9/2012 |
| TW | 201322503 A | 6/2013 |

* cited by examiner

*Primary Examiner* — Mark W Tornow
(74) *Attorney, Agent, or Firm* — Muncy, Geissler, Olds & Lowe, P.C.

(57) ABSTRACT

A LED package comprises an LED chip, a reflective structure which encloses the LED chip, a wavelength conversion structure placed on the LED chip, and an absorbing structure which encloses or is placed on the reflective structure.

18 Claims, 16 Drawing Sheets

I14

I15

I16

I18

I19

I20

LED PACKAGE

CROSS-REFERENCE TO RELATED APPLICATION

This application claims the benefit of Taiwan Patent Application No. 108112585, filed on Apr. 11, 2019, in the Taiwan Intellectual Property Office the disclosure of which is incorporated herein by reference in its entirety.

FIELD OF THE DISCLOSURE

The present disclosure relates to a LED package, and more particularly to an LED package having a reflective structure and an absorbing structure that can reduce the secondary light for improving the light efficiency.

BACKGROUND OF THE DISCLOSURE

LED is a light-emitting device that uses semiconductor as its material. The mechanism for LED to emit light is based on the recombination of electrons and holes in the semiconductor materials. Currently, applying LED to infrared sensing device is a rising business trend to the market. The SMD (Surface Mounted Device) LED has some advantages such as light weight and small volume, so that it is suitable for small sensing device.

However, comparing to the small size sensing device, for example, the sensing device arranged inside the mobile phone, the whole package size of the SMD LED is still too large, so that there is still a limit for applying SMD LED into the small size sensing device. In addition, although the environmental light can be reduced by covering the absorbing material to the LED package, the light efficiency of the LED package is still decreased. As a result, the location of the object can't be detected by the sensing device successfully.

SUMMARY OF THE DISCLOSURE

The present disclosure provides an LED package including an LED chip, a reflective structure which encloses the LED chip, a wavelength conversion structure placed on the LED chip, and an absorbing structure enclosing or placed on the reflective structure.

The present disclosure also provides an LED package including an LED chip, a reflective structure having an inner surface and a bottom surface with an angle formed between the inner surface and the bottom surface, a wavelength conversion structure which is placed on or encloses the LED chip, and an absorbing structure which encloses the reflective structure.

The LED package of the present disclosure has both the reflective structure and the absorbing structure so that when the LED package is used as the light source of a sensing device, the absorbing structure can absorb the light back to the wavelength conversion structure caused by the total internal reflection of the wavelength conversion structure, reflection or scattering inside the LED package. In addition, the absorbing structure can also absorb the environmental light, so that the secondary light with time difference produced directly or indirectly by the LED package can be absorbed by the absorbing structure. The sensing error caused by the time difference between the secondary light and the first light which incidents into the object and sensing device sequentially can be avoided. The interference caused by the environmental light to the sensing device can be avoided, too. Accordingly, the accuracy of the sensing device is improved. Furthermore, the absorbing structure has less or even no contact with the LED chip, which results in less light emitted from the LED chip absorbed by the absorbing structure, such that the brightness of the LED package is less likely to be affected by that. Still, the reflective structure also enhances the brightness of the LED. Accordingly, when the LED package is used as the light source of the sensing device, the brightness of the LED package is in good performance, therefore the location of the object can be detected by the sensing device successfully.

BRIEF DESCRIPTION OF THE DRAWINGS

The structure and the technical means adopted by the present disclosure to achieve the above and other objects can be best understood by referring to the following detailed description of the embodiments and the accompanying drawings, wherein.

DETAILED DESCRIPTION OF THE EMBODIMENTS

Figure 1A:
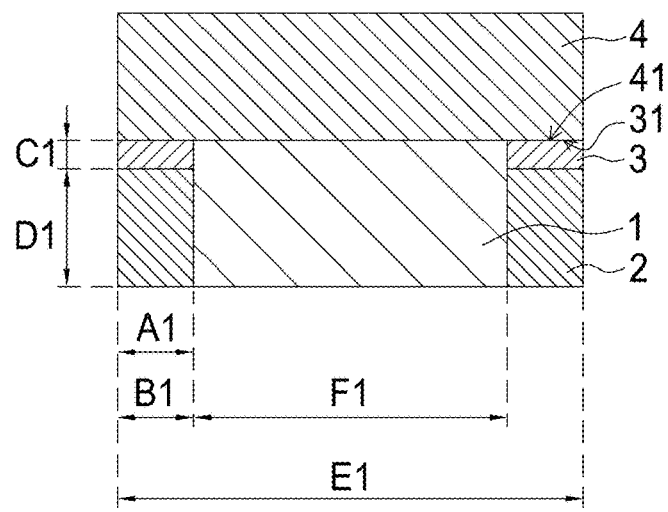
FIG. 1A shows the side view of the LED package in accordance with a first embodiment of the present disclosure.

The present disclosure of an LED package will now be described with some embodiments thereof and with reference to the accompanying drawings. Elements that are the same in the embodiments are denoted by the same reference numerals.

Figure 1B:
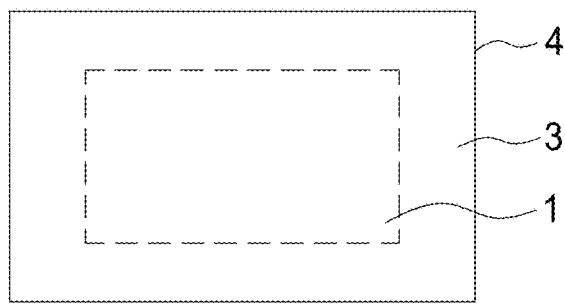
FIG. 1B shows the top view of the LED package in accordance with a first embodiment of the present disclosure.

FIGS. 1A and 1B show the side view and top view of the LED package in accordance with a first embodiment of the present disclosure respectively. The LED package I1 includes an LED chip 1, a reflective structure 2, an absorbing structure 3, and a wavelength conversion structure 4.

FIG. 1A shows the side view of the LED package in accordance with first embodiment of the present disclosure. The reflective structure 2 and the absorbing structure 3 of the LED package I1 enclose the LED chip 1, and the absorbing structure 3 is placed on the reflective structure 2. The horizontal thickness A1 of the absorbing structure 3 is equal or approximately to the horizontal thickness B1 of the reflective structure 2. The proportion of the longitudinal height C1 of the absorbing structure 3 to the longitudinal height D1 of the reflective structure 2 can be from 1:3 to 1:10 and is preferably from 1:6 to 1:7. The top surface 31 of the absorbing structure 3 and the top surface 11 of the LED chip 1 are practically flush with each other within the manufacturing tolerance. The wavelength conversion structure 4 is placed on the absorbing structure 3 and the LED chip 1 so that the top surface 31 of the absorbing structure 3 contacts the bottom surface 41 of the wavelength conversion structure 4. The horizontal width E1 of the wavelength conversion structure 4 is equal or approximate to the horizontal width F1 of the LED chip 1 plus twice of the horizontal thickness A1 of the absorbing structure 3. The absorbing structure 3 can be made of graphite powder, for example, flake graphite powder, artificial graphite powder, expanded graphite powder, vermicular graphite powder, amorphous graphite powder, or graphite compound. The foregoing materials of the absorbing structure 3 are only exemplary and not a limitation. The reflective structure 2 can be made of a high reflectivity material, for example, silver, $TiO_2$, $ZrO_2$, $Nb_2O_5$, $Al_2O_3$, $SiO_2$, $MgF_2$, or AlN. The reflective structure 2 can be further made of a high reflectivity material with an additive, for example, silicone rubber adding with $TiO_2$. The foregoing material of the reflective structure 2 is only exemplary and not a limitation. Besides, when the reflective structure 2 is able to conduct electricity, there is an insulative structure (not shown in FIG. 1A) between the reflective structure 2 and the LED chip 1. The wavelength conversion structure 4 can be a gum adding with wavelength converting particles like phosphors or quantum dot or a membrane having quantum dots. A yellow-green light, a red light, a blue light, an infrared light, or an ultraviolet light can be made by phosphors or quantum dot. The foregoing materials of the wavelength conversion structure 4 are only exemplary and not a limitation.

FIG. 1B shows the top view of the LED package in accordance with first embodiment of the present disclosure. FIG. 1B shows that the reflective structure (not shown in FIG. 1B) and the absorbing structure 3 of the LED Package I1 enclose the LED chip 1.

Figure 2:
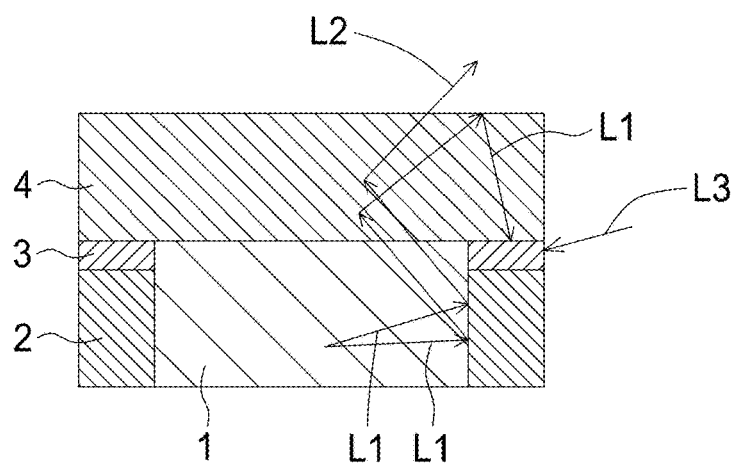
FIG. 2 shows the light path of the light emitted by the LED chip in accordance with the first embodiment of the present disclosure.

FIG. 2 shows the light path of the light emitted by the LED chip in accordance with first embodiment of the present disclosure. FIG. 2 shows that a first light L1 is reflected by the reflective structure 2 to the wavelength conversion structure 4, then part of the first light L1 is absorbed by the wavelength conversion structure 4 so that a second light L2 is produced. The second light L2 is emitted away from the wavelength conversion structure 4. The remaining part of the first light L1 not absorbed by the wavelength conversion structure 4 and still moving within the wavelength conversion structure 4 (including those do not leave the wavelength conversion structure 4 and/or leave the wavelength conversion structure 4 and return, not shown in FIG. 2) can be absorbed by the absorbing structure 3. The second light L2 produced by the wavelength conversion structure 4 and still moving within the wavelength conversion structure 4 (including those do not leave the wavelength conversion structure 4 and/or leave the wavelength conversion structure 4 and return, not shown in FIG. 2) can also be absorbed by the absorbing structure 3. The environmental light L3 which enters into the LED package I1 (including those enter into the absorbing structure 3 directly, enter into the wavelength conversion structure 4, and/or enter into the LED chip 1, not shown in FIG. 2) can also be absorbed by the absorbing structure 3. The first light L1 is for example a red light, a green light, or a blue light. The foregoing red light, green light, or blue light is only exemplary and not a limitation. The second light L2 is a light having a wavelength longer than that of the first light L1, for example an infrared light.

Figure 3:
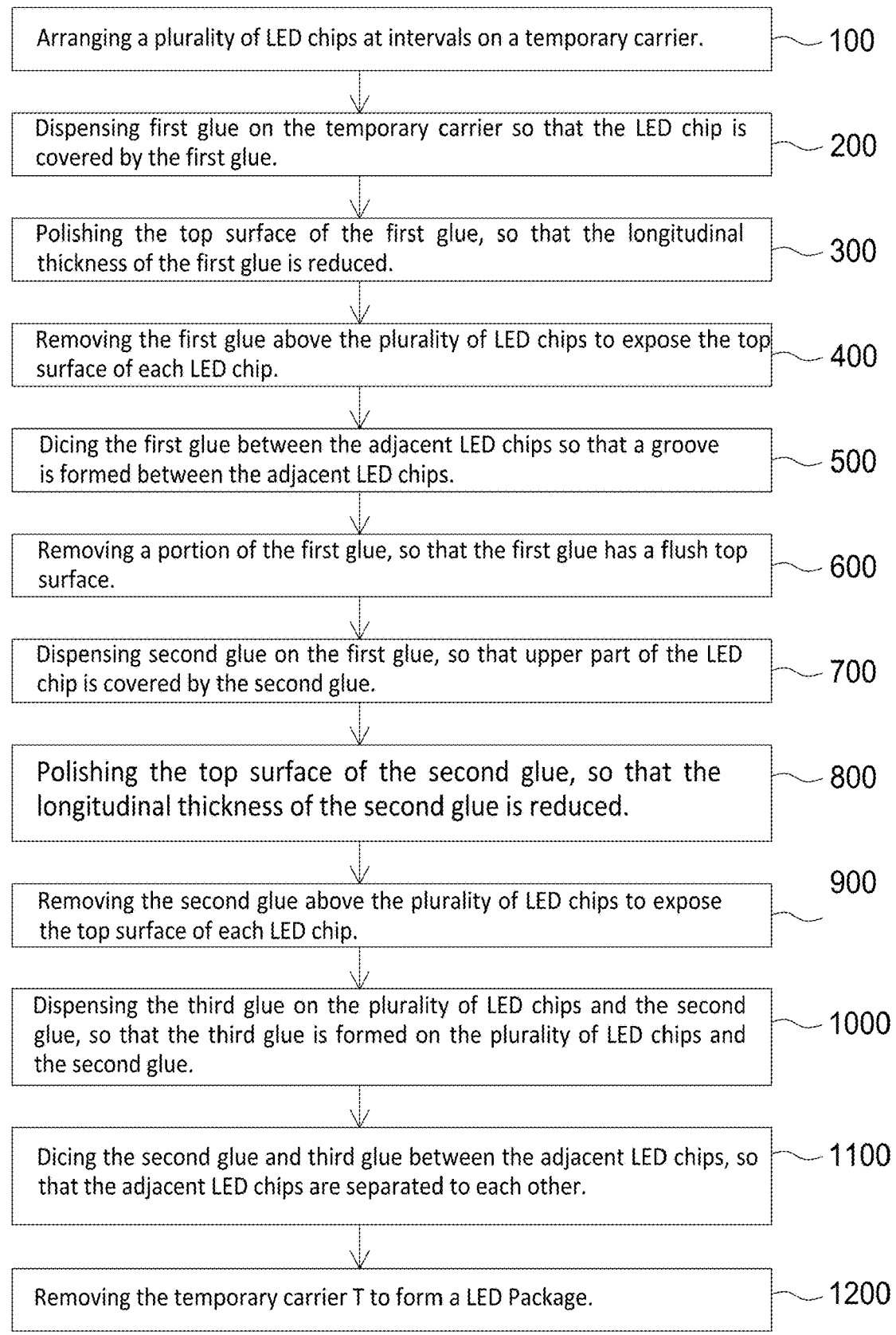
FIG. 3 shows the schematic diagram of manufacturing process of manufacturing method to the LED package in accordance with the first embodiment of the present disclosure.
Figure 4A:
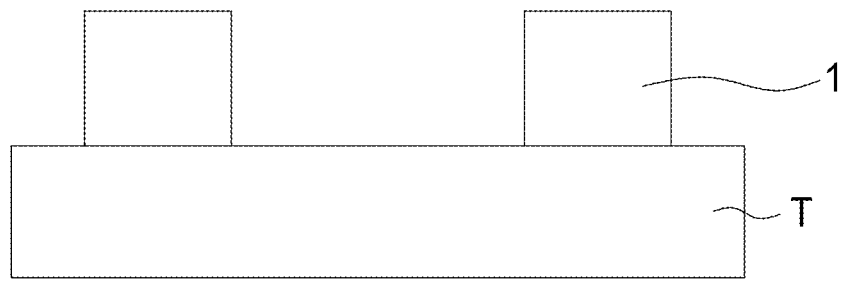
FIGS. 4A to 4L are the cross-sectional views showing a manufacturing process of the light-emitting device in accordance with the first embodiment of the present disclosure.
Figure 4B:
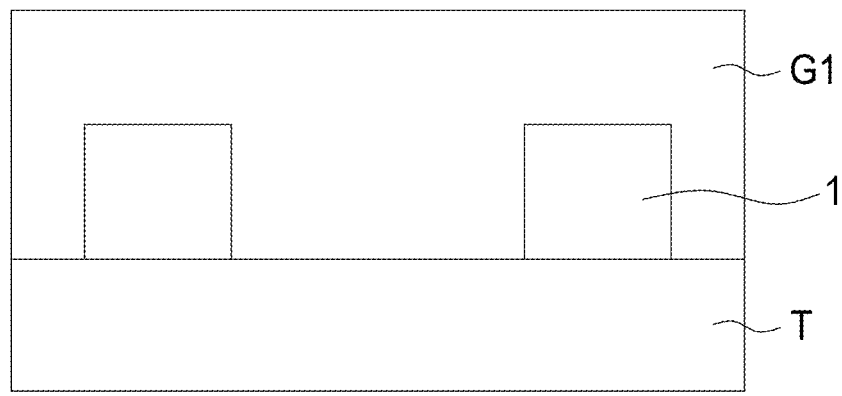
Figure 4C:
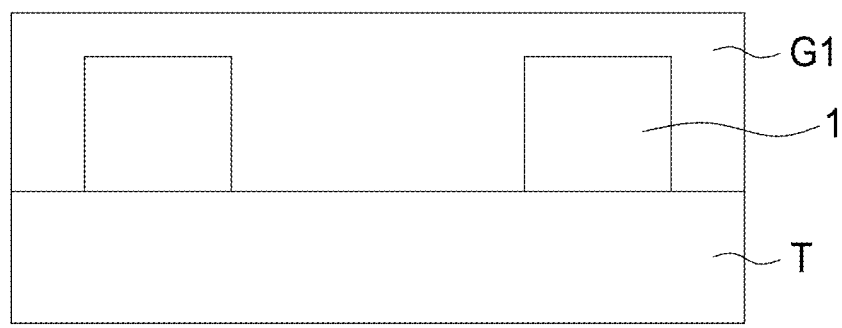
Figure 4D:
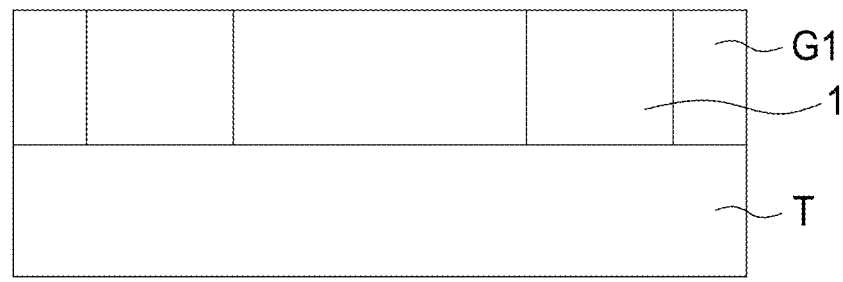
Figure 4E:
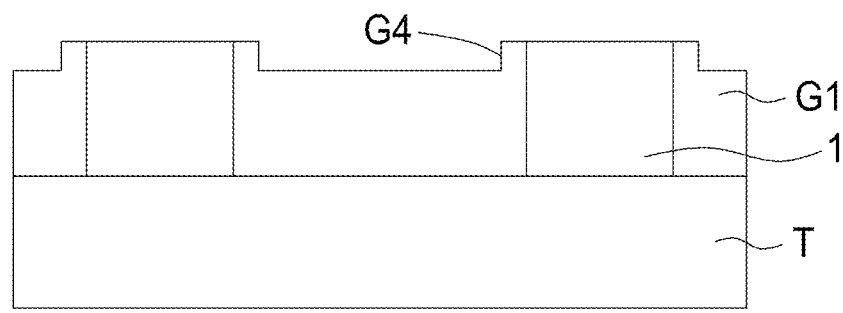
Figure 4F:
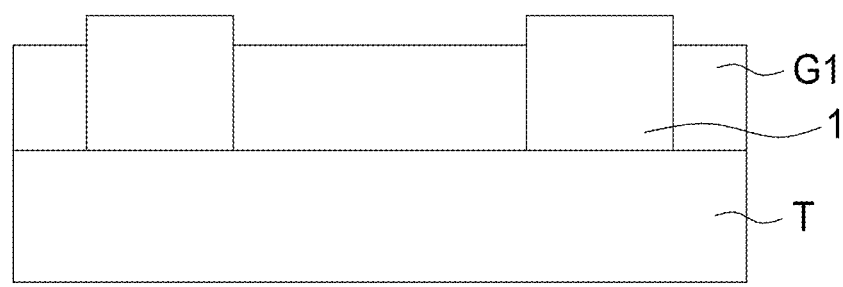
Figure 4G:
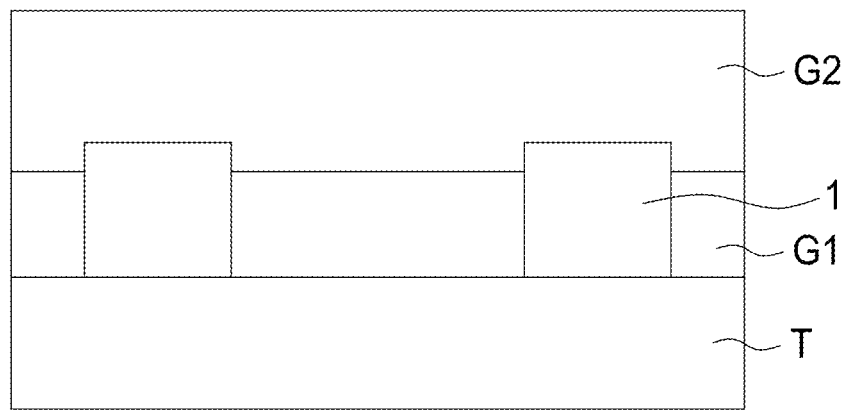
Figure 4H:
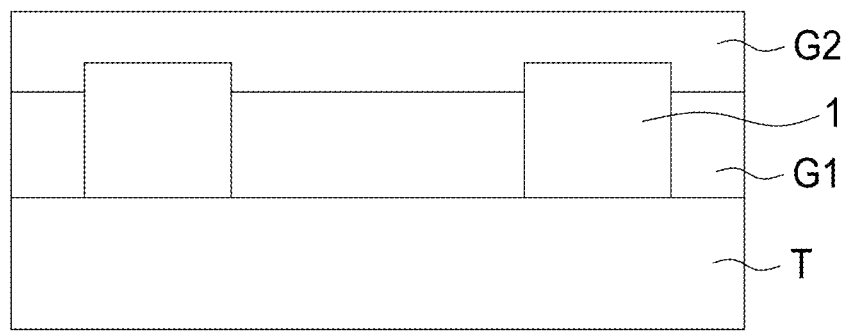
Figure 4I:
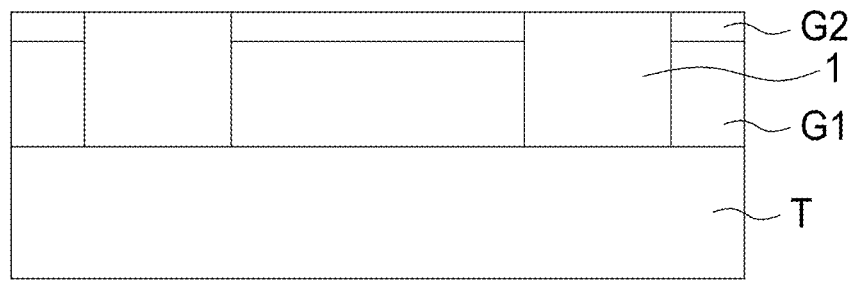
Figure 4J:
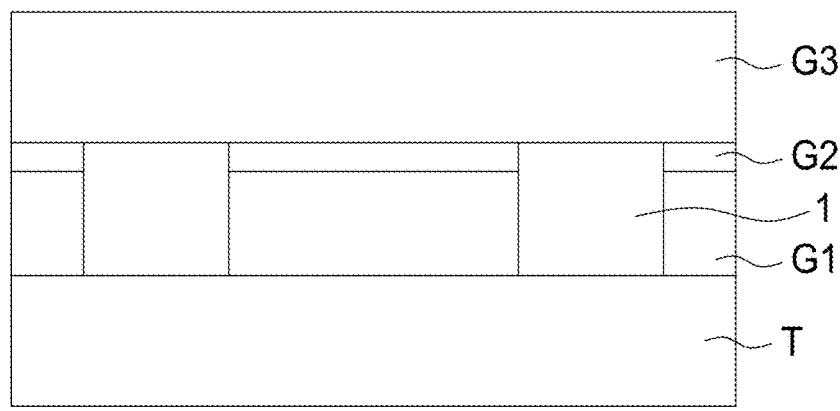
Figure 4K:
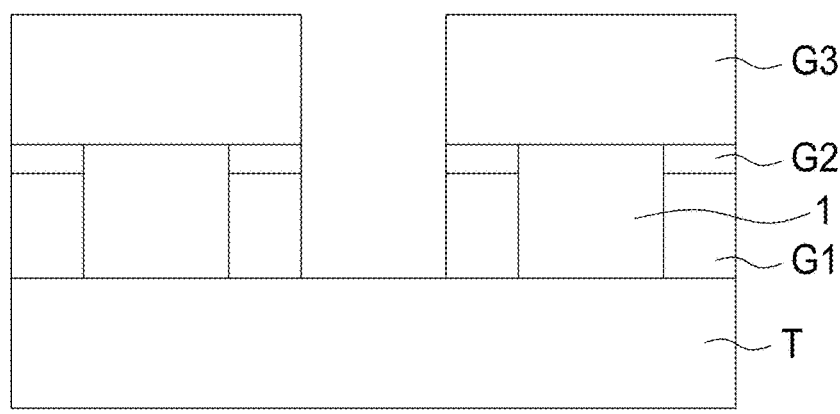
Figure 4L:
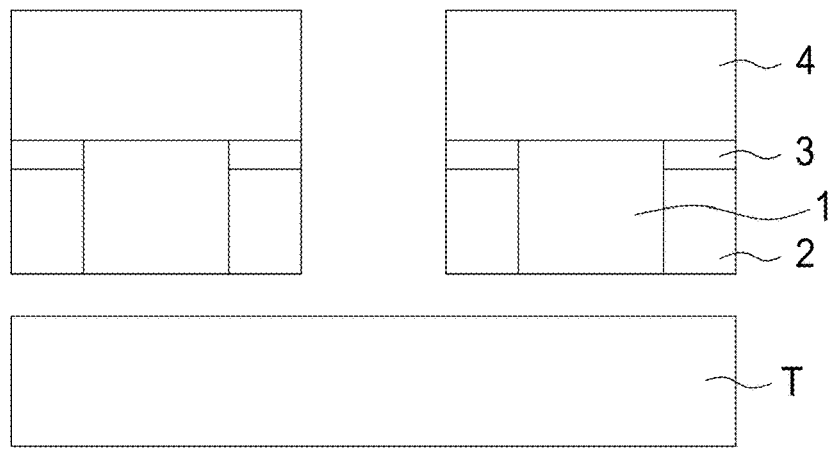

FIG. 3A shows the manufacturing process of the LED package in accordance with first embodiment of the present disclosure. FIGS. 4A~4L are the cross-sectional views of showing a manufacturing process to the light-emitting device in accordance with first embodiment of the present disclosure. The manufacturing method of the light-emitting device in accordance with first embodiment of the present disclosure includes the following steps:

Step 100: Arranging a plurality of LED chips 1 at intervals on a temporary carrier T. The foregoing temporary carrier can be glass or GaN. The step 100 is corresponding to FIG. 4A.

Step 200: Dispensing first glue G1 on the temporary carrier T so that the LED chip 1 is covered by the first glue G1. The foregoing first glue G1 can be made of a high reflectivity material, for example, silver, $TiO_2$, $ZrO_2$, $Nb_2O_5$, $Al_2O_3$, $SiO_2$, $MgF_2$, or AlN. The first glue G1 can further be made of a high reflectivity material with an additive, for example, silicone rubber adding with $TiO_2$. The step 200 is corresponding to FIG. 4B.

Step 300: Polishing the top surface of the first glue G1 for, for instance, 5 to 10 minutes, so that the longitudinal thickness of the first glue G1 is reduced. The step 300 is corresponding to FIG. 4C.

Step 400: Removing the first glue G1 above the plurality of LED chips 1 to expose the top surface of each LED chip 1. The step 400 is corresponding to FIG. 4D.

Step 500: Dicing the first glue G1 between the adjacent LED chips 1 for, for instance, 20 to 60 minutes so that a groove G4 is formed between the adjacent LED chips 1. The step 500 is corresponding to FIG. 4E.

Step 600: Removing a portion of the first glue G1 which surrounds the outside surface of each LED chip 1 that closes to the top surface of each LED chip 1 so that the first glue G1 has a flat top surface. The step 600 is corresponding to FIG. 4F.

Step 700: Dispensing second glue G2 on the first glue G1, so that upper part of the LED chip 1 is covered by the second glue G2. The second glue G2 can be made of a graphite powder, for example, flake graphite powder, artificial graphite powder, expanded graphite powder, vermicular graphite powder, amorphous graphite powder or graphite compound. The step 700 is corresponding to FIG. 4G.

Step 800: Polishing the top surface of the second glue G2 for, for instance, 5 to 10 minutes, so that the longitudinal thickness of the second glue G2 is reduced. The step 800 is corresponding to FIG. 4H.

Step 900: Removing the second glue G2 above the plurality of LED chips 1 to expose the top surface of each LED chip 1 so the second glue G2 has a top surface that flushes with the top surface of each LED chip 1. The step 900 is corresponding to FIG. 4I.

Step 1000: Dispensing the third glue G3 on the plurality of LED chips 1 and the second glue G2 so that the third glue G3 is formed on the plurality of LED chips 1 and the second glue G2. The foregoing third glue G3 can be a gum adding with wavelength converting particles like phosphors or quantum dot or a membrane having quantum dots. A yellow-green light, a red light, a blue light, an infrared or an ultraviolet can be produced by phosphors or quantum dot. The step 1000 is corresponding to FIG. 4J.

Step 1100: Dicing the second glue G2 and third glue G3 between the adjacent LED chips 1 for, for instance, 20 to 60 minutes, so that the adjacent LED chips 1 are separated to each other. The step 1100 is corresponding to FIG. 4K.

Step 1200: Removing the temporary carrier T to form a LED Package I1 which comprises an LED chip 1, a reflective structure 2, an absorbing structure 3, and a wavelength conversion structure 4. The reflective structure 2 and the absorbing structure 3 of the present embodiment enclose the LED chip 1, and the absorbing structure 3 is placed on the reflective structure 2. The step 1200 is corresponding to FIG. 4L.

Figure 5:
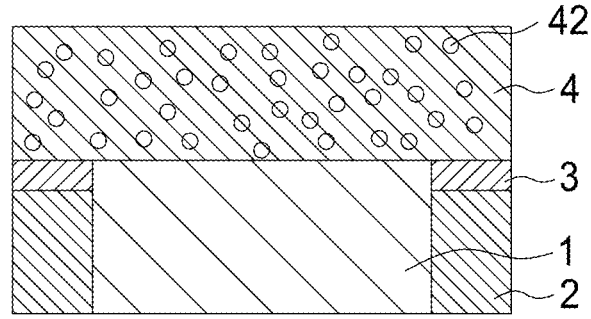
FIG. 5 shows the side view of the LED package in accordance with a second embodiment of the present disclosure.

FIG. 5 shows the side view of the LED package in accordance with a second embodiment of the present disclosure. The LED package I2 includes an LED chip 1, a reflective structure 2, an absorbing structure 3, and a wavelength conversion structure 4. The configuration relation among the LED chip 1, the reflective structure 2, the absorbing structure 3 and the wavelength conversion structure 4 of second embodiment is the same as that of the first embodiment of the present disclosure. However, the wavelength conversion structure 4 of second embodiment of the present disclosure further contains a plurality of scattering particles 42, which is different from the first embodiment of the present disclosure. A part of the first light L1 not absorbed by the wavelength conversion structure 4 remains in the wavelength conversion structure 4 and collides with the scattering particles 42, which results in scattering that increases the probability of being converted by the wavelength converting particles in the wavelength conversion structure 4 to produce the second light L2. In other words, the scattering particles 42 increase the probability for producing the second light L2.

Figure 6:
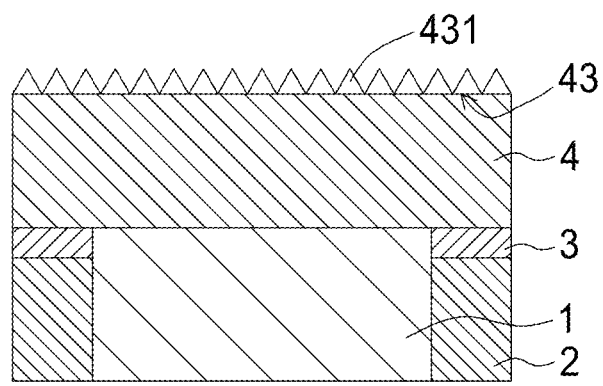
FIG. 6 shows the side view of the LED package in accordance with a third embodiment of the present disclosure.

FIG. 6 shows the side view of the LED package in accordance with a third embodiment of the present disclosure. The LED package I3 includes an LED chip 1, a reflective structure 2, an absorbing structure 3, and a wavelength conversion structure 4. The configuration relation among the LED chip 1, the reflective structure 2, the absorbing structure 3, and the wavelength conversion structure 4 of the third embodiment is the same as that of the first embodiment of the present disclosure. However, a patterned structure 431 is set on a top surface 43 of the wavelength conversion structure 4, which is different from the first embodiment of the present disclosure. The patterned structure 431 reduces total internal reflection so that light extraction efficiency of the LED package I3 is further improved. The shape of the pattern of the patterned structure 431 can be cone or pyramid.

Figure 7:
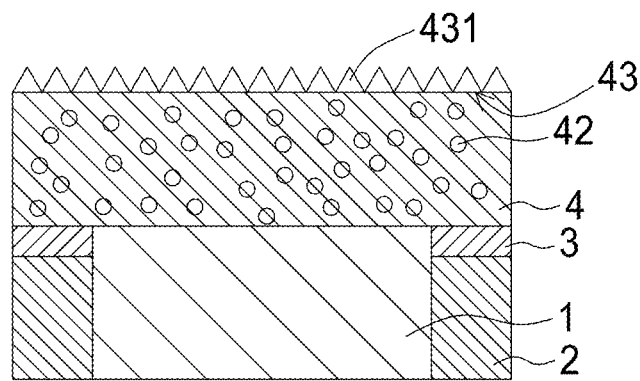
FIG. 7 shows the side view of the LED package in accordance with a fourth embodiment of the present disclosure.

FIG. 7 shows the side view of the LED package in accordance with a fourth embodiment of the present disclosure. The LED package I4 includes an LED chip 1, a reflective structure 2, an absorbing structure 3, and a wavelength conversion structure 4. The configuration relation among the LED chip 1, the reflective structure 2, the absorbing structure 3, and the wavelength conversion structure 4 of the fourth embodiment is the same as that of the first embodiment of the present disclosure. However, in the fourth embodiment, the wavelength conversion structure 4 further includes a plurality of scattering particles 42 and a patterned structure 431 set on a top surface 43 of the wavelength conversion structure 4. A part of the first light L1 not absorbed by the wavelength conversion structure 4 remains in the wavelength conversion structure 4 and collides with the scattering particles 42, which results in scattering that increases the probability of being converted by the wavelength converting particles in the wavelength conversion structure 4 to produce the second light L2. In other words, the scattering particles 42 increase the probability for producing the second light L2 and further improve the light scattering efficiency of the LED package I4. In addition, the patterned structure 431 reduces total internal reflection, so that light extraction efficiency of the LED Package I4 is further improved.

Figure 8A:
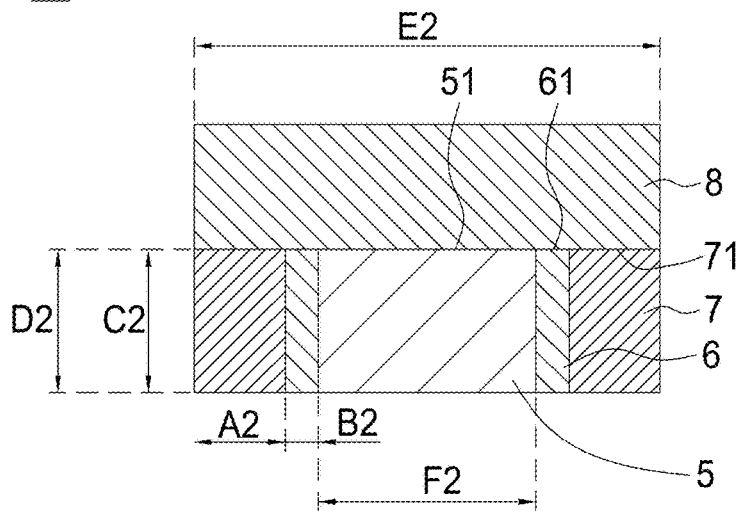
FIG. 8A shows the side view of the LED package in accordance with a fifth embodiment of the present disclosure.
Figure 8B:
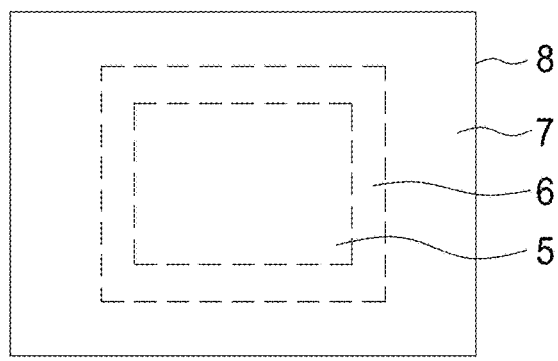
FIG. 8B shows the top view of the LED package in accordance with a fifth embodiment of the present disclosure.

FIGS. 8A and 8B show the side view and top view of the LED package in accordance with a fifth embodiment of the present disclosure respectively. The LED package I5 includes an LED chip 5, a reflective structure 6, an absorbing structure 7, and a wavelength conversion structure 8.

FIG. 8A shows the side view of the LED package in accordance with a fifth embodiment of the present disclosure. The reflective structure 6 of the LED package I5 encloses the LED chip 1, and the absorbing structure 7 further encloses the reflective structure 6. The horizontal thickness B2 of the reflective structure 6 can be 50 μm. The longitudinal height C2 of the absorbing structure 7 is equal or approximate to the longitudinal height D2 of the reflective structure 6. The top surface 71 of the absorbing structure 7 and the top surface 51 of the LED chip 5 are almost flush to each other within the manufacturing tolerance. The wavelength conversion structure 8 is placed on the reflective structure 6, the absorbing structure 7, and the LED chip 5. The horizontal width E2 of the wavelength conversion structure 8 is equal or approximate to the horizontal width F2 of the LED chip 5 plus twice of the horizontal thickness B2 of the reflective structure 6 and twice of the horizontal thicknesss A2 of the absorbing structure 7. The absorbing structure 7 can be made of a graphite powder, for example, flake graphite powder, artificial graphite powder, expanded graphite powder, vermicular graphite powder, amorphous graphite powder or a graphite compound. The foregoing materials of the absorbing structure 7 are only exemplary and not a limitation. The reflective structure 6 can be made of a high reflectivity material, for example, silver, $TiO_2$, $ZrO_2$, $Nb_2O_5$, $Al_2O_3$, $SiO_2$, $MgF_2$, or AlN. The reflective structure 6 can be further made of a high reflectivity material with an additive, for example, silicone rubber adding with $TiO_2$. However, the foregoing materials of the reflective structure 6 are only exemplary and not a limitation. Besides, when the reflective structure 6 is able to conduct electricity, there is an insulative structure (not shown in FIG. 8A) between the reflective structure 6 and the LED chip 5. The wavelength conversion structure 8 can be a gum adding with wavelength converting particles like phosphors or quantum dot or a membrane having quantum dots. A yellow-green light, a red light, a blue light, an infrared or an ultraviolet can be generated by phosphors or quantum dot. The foregoing materials of the wavelength conversion structure 8 are only exemplary and not a limitation.

FIG. 8B shows the top view of the LED package in accordance with a fifth embodiment of the present disclosure. In FIG. 8B, the reflective structure 6 of the LED package I5 encloses the LED chip 5. In addition, the absorbing structure 7 further encloses the reflective structure 6.

Figure 9:
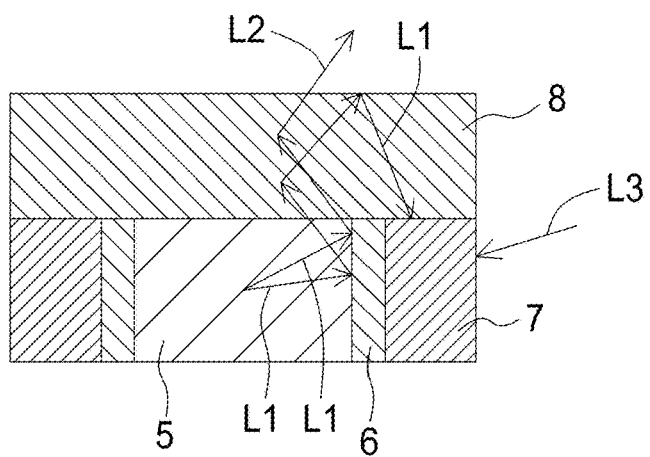
FIG. 9 shows the light path of the light emitted by the LED chip in accordance with a fifth embodiment of the present disclosure.

FIG. 9 shows the light path of the light emitted by the LED chip in accordance with fifth embodiment of the present disclosure. In FIG. 9, a first light L1 is reflected by the reflective structure 6 to the wavelength conversion structure 8, then part of the first light L1 is absorbed by the wavelength conversion structure 8 so that a second light L2 is converted from the first light L1 and emits. The remaining part of the first light L1 not absorbed by the wavelength conversion structure 8 and still moving within the wavelength conversion structure 8 (including those do not leave the wavelength conversion structure 8 and/or those leave the wavelength conversion structure 8 and then return, not shown in FIG. 9) can be absorbed by the absorbing structure 7. The second light L2 produced by the wavelength conversion structure 8 and still moving within the wavelength conversion structure 8 (including those not leaving the wavelength conversion structure 8 and/or those leaving the wavelength conversion structure 8 and then returning, not shown in FIG. 9) can also be absorbed by the absorbing structure 7. Besides, the environmental light L3 which enters into the LED package I5 (including those entering into the absorbing structure 7, entering into the wavelength conversion structure 8, and/or entering into the LED chip 5, not shown in FIG. 9) can also be absorbed by the absorbing structure 7. The first light L1 is for example a red light, a green light or a blue light. The foregoing red light, green light or blue light is only exemplary and not a limitation. The second light L2 is an infrared light in this embodiment.

Figure 10:
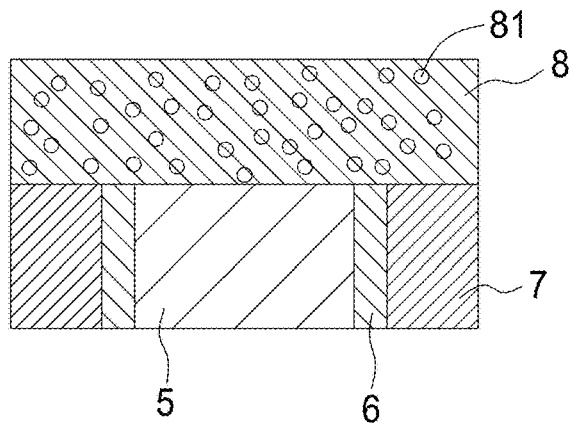
FIG. 10 shows the side view of the LED package in accordance with a sixth embodiment of the present disclosure.

FIG. 10 shows the side view of the LED package in accordance with a sixth embodiment of the present disclosure. The LED package I6 includes an LED chip 5, a reflective structure 6, an absorbing structure 7 and a wavelength conversion structure 8. The configuration relation among the LED chip 5, the reflective structure 6, the absorbing structure 7 and the wavelength conversion structure 8 of the sixth embodiment is the same as that of the fifth embodiment of the present disclosure. However, the wavelength conversion structure 8 of the sixth embodiment of the present disclosure further contains a plurality of scattering particles 81, which is different from the fifth embodiment of the present disclosure. A part of the first light L1 not absorbed by the wavelength conversion structure 8 remains within the wavelength conversion structure 8 and collides with the scattering particles 81, which results in scattering that increases the probability of being converted by the wavelength converting particles in the wavelength conversion structure 8 to produce the second light L2. Accordingly, the scattering particles 81 increase the probability for producing the second light L2 and further improve the light scattering efficiency of the LED package I6.

Figure 11:
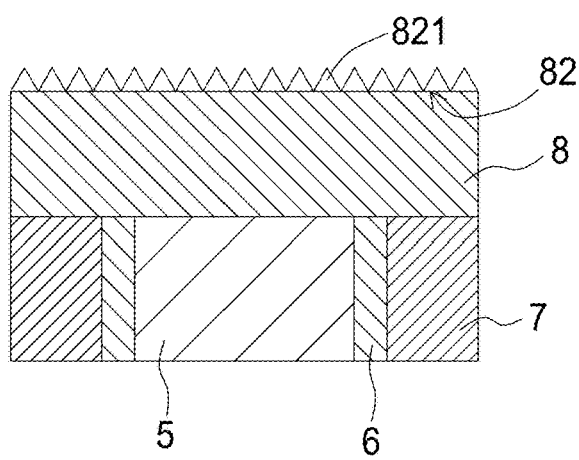
FIG. 11 shows the side view of the LED package in accordance with a seventh embodiment of the present disclosure.

FIG. 11 shows the side view of the LED package in accordance with a seventh embodiment of the present disclosure. The LED package I7 includes an LED chip 5, a reflective structure 6, an absorbing structure 7 and a wavelength conversion structure 8. The configuration relation among the LED chip 5, the reflective structure 6, the absorbing structure 7 and the wavelength conversion structure 8 of the seventh embodiment is the same as that of the fifth embodiment of the present disclosure. However, a patterned structure 821 is set on a top surface 82 of the wavelength conversion structure 8, which is different from the fifth embodiment of the present disclosure. The patterned structure 821 reduces total internal reflection so that light extraction efficiency of the LED package I7 is further improved. The shape of the pattern of the patterned structure 821 can be cone or pyramid.

Figure 12:
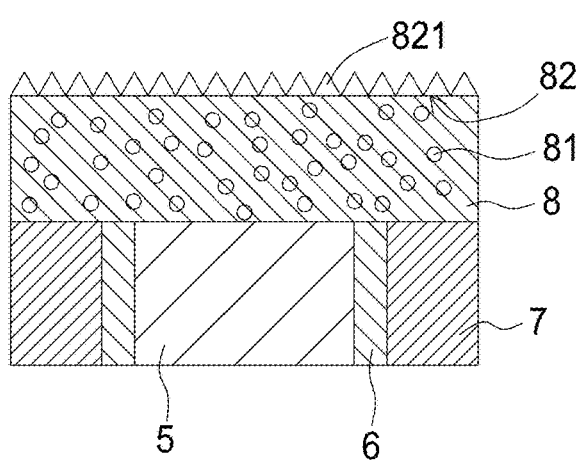
FIG. 12 shows the side view of the LED package in accordance with an eighth embodiment of the present disclosure.

FIG. 12 shows the side view of the LED package in accordance with an eighth embodiment of the present disclosure. The LED package I8 includes an LED chip 5, a reflective structure 6, an absorbing structure 7 and a wavelength conversion structure 8. The configuration relation among the LED chip 5, the reflective structure 6, the absorbing structure 7 and the wavelength conversion structure 8 is the same as that of the fifth embodiment of the present disclosure. However, in the eighth embodiment, the wavelength conversion structure 8 further includes a plurality of scattering particles 81 and a patterned structure 821 set on a top surface 82 of the wavelength conversion structure 8. A part of the first light L1 not absorbed by the wavelength conversion structure 8 remains within the wavelength conversion structure 8 and collides with the scattering particles 81, which results in scattering that increases the probability of being converted by the wavelength converting particles in the wavelength conversion structure 8 to produce the second light L2. Accordingly, the scattering particles 81 increase the probability for producing the second light L2 and further improve the light scattering efficiency of the LED package I8. In addition, the patterned structure 821 reduces total internal reflection so that light extraction efficiency of the LED Package I8 is further improved.

Figure 13A:
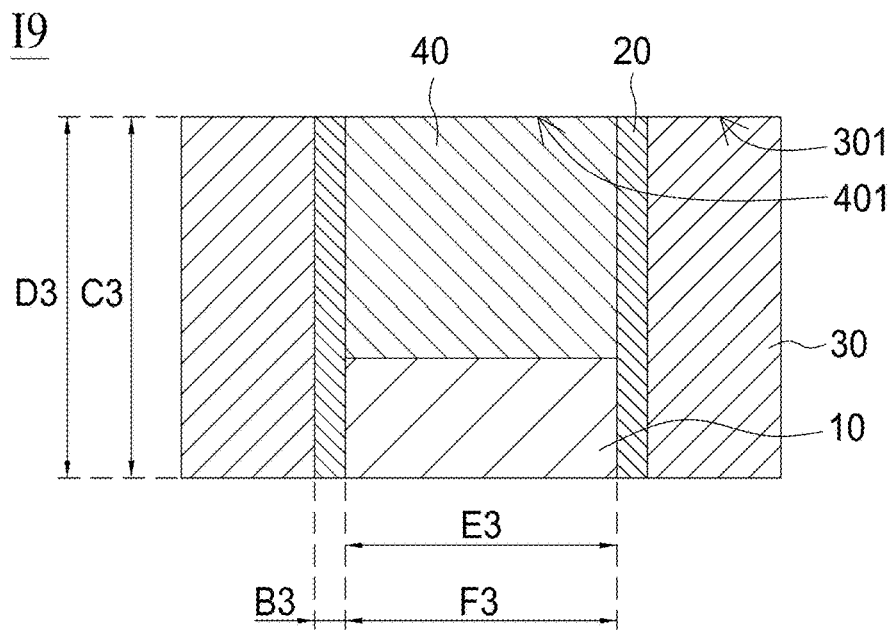
FIG. 13A shows the side view of the LED package in accordance with a ninth embodiment of the present disclosure.
Figure 13B:
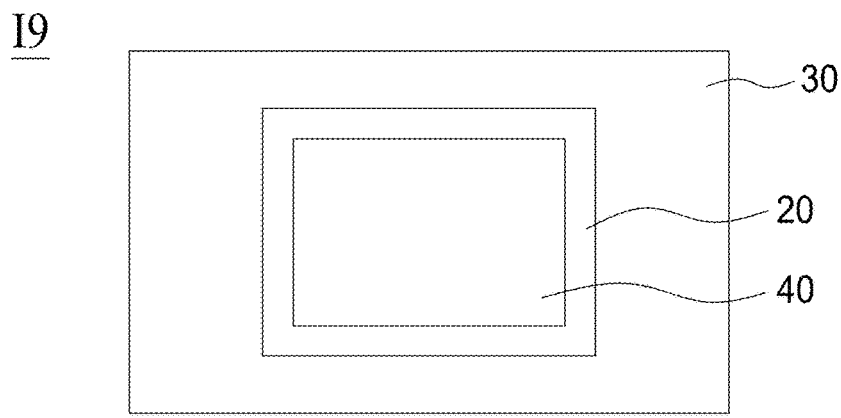
FIG. 13B shows the top view of the LED package in accordance with a ninth embodiment of the present disclosure.

FIGS. 13A and 13B show the side view and top view of the LED package in accordance with a ninth embodiment of the present disclosure respectively. The LED package I9 includes an LED chip 10, a reflective structure 20, an absorbing structure 30, and a wavelength conversion structure 40.

FIG. 13A shows the side view of the LED package in accordance with the ninth embodiment of the present disclosure. The wavelength conversion 40 of the LED package I9 is placed on the LED chip 10. The horizontal width E3 of the wavelength conversion structure 40 is equal or approximate to the horizontal width F3 of the LED chip 10. The reflective structure 20 encloses the LED chip 10 and the wavelength conversion 40, and the absorbing structure 30 further encloses the reflective structure 20. The horizontal thickness B3 of the reflective structure 20 can be 50 µm. The longitudinal height C3 of the absorbing structure 30 is equal or approximate to the longitudinal height D3 of the reflective structure 20. The top surface 301 of the absorbing structure 30 and the top surface 401 of the wavelength conversion structure 40 are almost flush to each other within the manufacturing tolerance. The absorbing structure 30 can be made of a graphite powder, for example, flake graphite powder, artificial graphite powder, expanded graphite powder, vermicular graphite powder, amorphous graphite powder or graphite compound. The foregoing materials of the absorbing structure 30 are only exemplary and not a limitation. The reflective structure 20 can be made of a high reflectivity material, for example, silver, $TiO_2$, $ZrO_2$, $Nb_2O_5$, $Al_2O_3$, $SiO_2$, $MgF_2$, or AlN. The reflective structure 20 can further be made of a high reflectivity material with an additive, for example, silicone rubber adding with TiO2. However, the foregoing materials of the reflective structure 20 are only exemplary and not a limitation. Besides, when the reflective structure 20 is able to conduct electricity, there is an insulative structure (not shown in FIG. 13A) between the reflective structure 20 and the LED chip 10. The wavelength conversion structure 40 can be a gum adding with wavelength converting particles like phosphors or quantum dot or a membrane having quantum dots. A yellow-green light, a red light, a blue light, an infrared light or an ultraviolet light can be made by phosphors or quantum dot. The foregoing materials of the wavelength conversion structure 40 are only exemplary and not a limitation.

FIG. 13B shows the top view of the LED package in accordance with the ninth embodiment of the present disclosure. FIG. 13B shows that the reflective structure 20 of the LED package I9 encloses the LED chip (not shown in FIG. 13B) and the wavelength conversion 40. In addition, the absorbing structure 30 further encloses the reflective structure 20.

Figure 14:
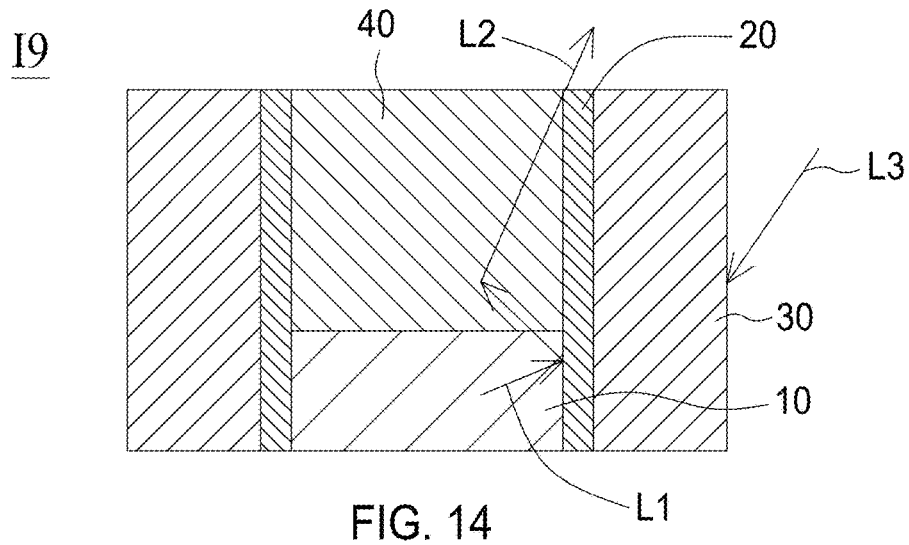
FIG. 14 shows the light path of the light emitted by the LED chip in accordance with the ninth embodiment of the present disclosure.

FIG. 14 shows the light path of the light emitted by the LED chip in accordance with the ninth embodiment of the present disclosure. FIG. 14 shows that a first light L1 is reflected by the reflective structure 20 to the wavelength conversion structure 40, then part of the first light L1 is absorbed by the wavelength conversion structure 20 so that a second light L2 is converted from the first light L1 and emits. The environmental light L3 which enters into the LED package I9 can be absorbed by the absorbing structure 30. The first light L1 is for example a red light, a green light or a blue light. The foregoing red light, green light or blue light is only exemplary and not a limitation. The second light L2 is an infrared light in this embodiment.

Figure 15:
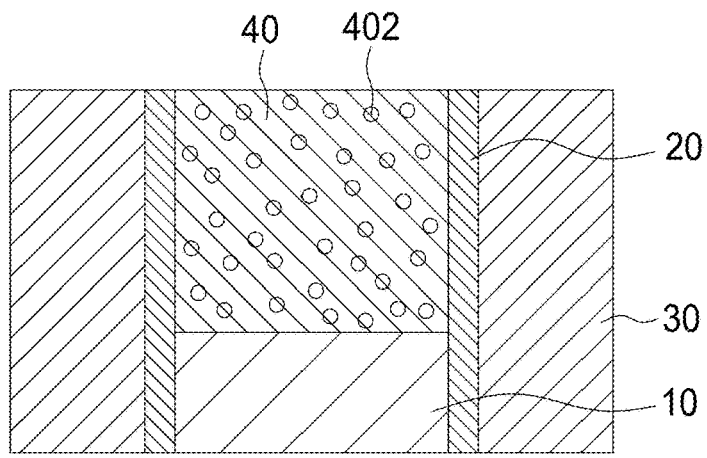
FIG. 15 shows the side view of the LED package in accordance with a tenth embodiment of the present disclosure.

FIG. 15 shows the side view of the LED package in accordance with a tenth embodiment of the present disclosure. The LED package I10 includes an LED chip 10, a reflective structure 20, an absorbing structure 30, and a wavelength conversion structure 40. The configuration relation among the LED chip 10, the reflective structure 20, the absorbing structure 30, and the wavelength conversion structure 40 of the tenth embodiment is the same as that of the ninth embodiment of the present disclosure. However, the wavelength conversion structure 40 of the tenth embodiment of the present disclosure further contains a plurality of scattering particles 402, which is different from the ninth embodiment of the present disclosure. A part of the first light L1 not absorbed by the wavelength conversion structure 40 remains in the wavelength conversion structure 40 and collides with the scattering particles 402, which results in scattering that increases the probability of being converted by the wavelength converting particles in the wavelength conversion structure 40 to produce the second light L2. Accordingly, the scattering particles 402 increase the probability for producing the second light L2 and further improve the light scattering efficiency of the LED package I10.

Figure 16:
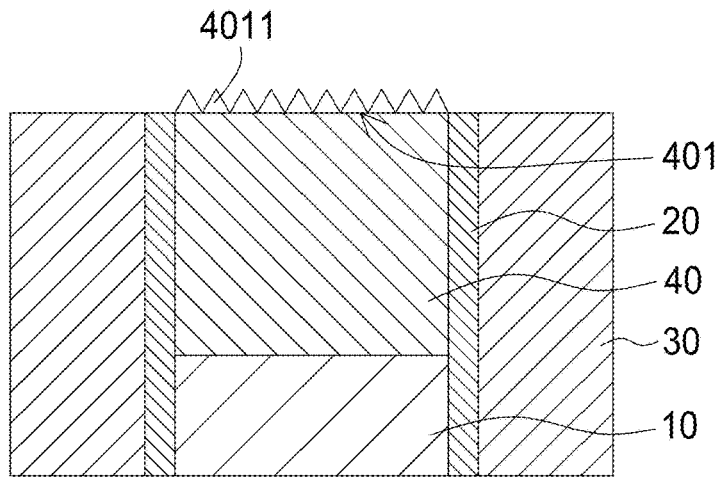
FIG. 16 shows the side view of the LED package in accordance with an eleventh embodiment of the present disclosure.

FIG. 16 shows the side view of the LED package in accordance with an eleventh embodiment of the present disclosure. The LED package I11 includes an LED chip 10, a reflective structure 20, an absorbing structure 30 and a wavelength conversion structure 40. The configuration relation among the LED chip 10, the reflective structure 20, the absorbing structure 30 and the wavelength conversion structure 40 of the eleventh embodiment is the same as that of the ninth embodiment of the present disclosure. However, a patterned structure 4011 is set on a top surface 401 of the wavelength conversion structure 40, which is different from the ninth embodiment of the present disclosure. The patterned structure 4011 reduces total internal reflection, so that light extraction efficiency of the LED package I11 is further improved. The shape of the patterned of the patterned structure 4011 can be cone or pyramid.

Figure 17:
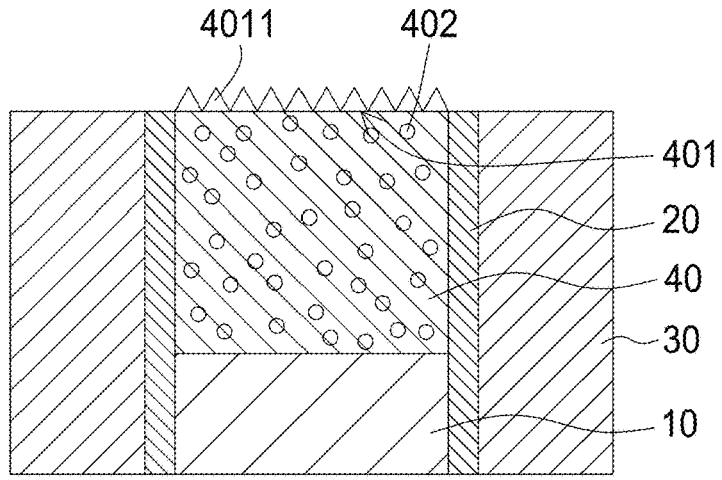
FIG. 17 shows the side view of the LED package in accordance with a twelfth embodiment of the present disclosure.

FIG. 17 shows the side view of the LED package in accordance with a twelfth embodiment of the present disclosure. The LED package I12 includes an LED chip 10, a reflective structure 20, an absorbing structure 30 and a wavelength conversion structure 40. The configuration relation among the LED chip 10, the reflective structure 20, the absorbing structure 30 and the wavelength conversion structure 40 is the same as that of the ninth embodiment of the present disclosure. However, in the twelfth embodiment, the wavelength conversion structure 40 of the twelfth embodiment of the present disclosure further includes a plurality of scattering particles 402 and a patterned structure 4011 set on a top surface 401 of the wavelength conversion structure 40. A part of the first light L1 not absorbed by the wavelength conversion structure 40 remains in the wavelength conversion structure 40 and collides with the scattering particles 402, which results in scattering that increases the probability of being converted by the wavelength converting particles in the wavelength conversion structure 40 to produce the second light L2. Accordingly, the scattering particles 402 increase the probability for producing the second light L2 and further improve the light converting efficiency of the LED package I12. In addition, the patterned structure 4011 reduces total internal reflection, so that light extraction efficiency of the LED package I12 is further improved.

Figure 18A:
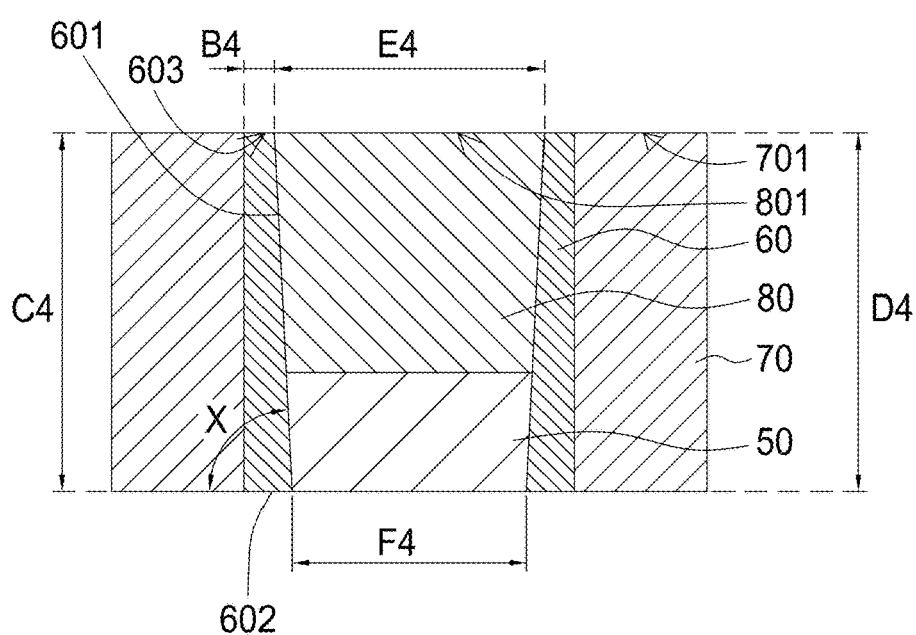
FIG. 18A shows the side view of the LED package in accordance with a thirteenth embodiment of the present disclosure.
Figure 18B:
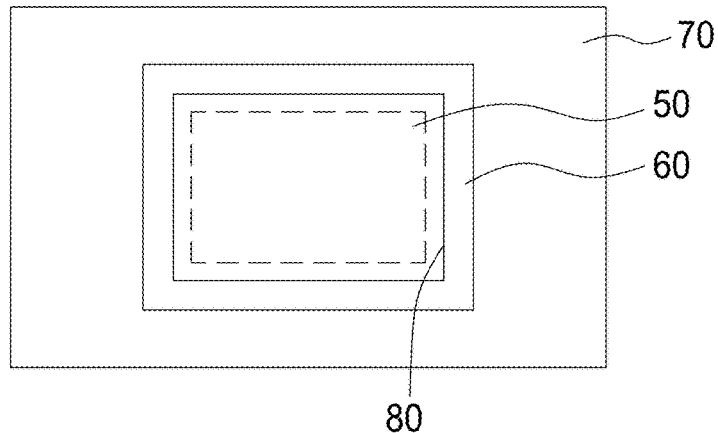
FIG. 18B shows the top view of the LED package in accordance with a thirteenth embodiment of the present disclosure.

FIGS. 18A and 18B show the side view and top view of the LED package in accordance with a thirteenth embodiment of the present disclosure respectively. The LED package I13 includes an LED chip 50, a reflective structure 60, an absorbing structure 70 and a wavelength conversion structure 80.

FIG. 18A shows the side view of the LED package in accordance with the thirteenth embodiment of the present disclosure. The wavelength conversion 80 of the LED package I13 is placed on the LED chip 50. The horizontal width E4 of the wavelength conversion structure 80 declines in a direction from the top to the bottom of the wavelength conversion 80. The horizontal width F4 of the LED chip 50 also declines in a direction from the top to the bottom of the LED chip 50 to the bottom of the wavelength conversion 80. The bottom horizontal width E4 of the wavelength conversion 80 is equal or approximate to the top horizontal width F4 of the LED chip 50. The reflective structure 60 encloses the LED chip 50 and the wavelength conversion 80, and an angle X is formed between an inner surface 601 and a bottom surface 602 of the reflective structure 60. The angle X is preferably between 60 degrees to 70 degrees. In addition, the absorbing structure 70 further encloses the reflective structure 60. The top horizontal thickness B4 of the reflective structure 60 can be 50 µm. The longitudinal height C4 of the absorbing structure 70 is equal to the longitudinal height D4 of the reflective structure 60. The top surface 603 of the reflective structure 60, the top surface 701 of the absorbing structure 70, and the top surface 801 of the wavelength conversion structure 80 are almost flush to each other within the manufacturing tolerance. The absorbing structure 70 can be made of a graphite powder, for example, flake graphite powder, artificial graphite powder, expanded graphite powder, vermicular graphite powder, amorphous graphite powder or graphite compound. The foregoing materials of the absorbing structure 70 are only exemplary and not a limitation. The reflective structure 60 can be made of a high reflectivity material, for example, silver, $TiO_2$, $ZrO_2$, $Nb_2O_5$, $Al_2O_3$, $SiO_2$, $MgF_2$, or AlN. The reflective structure 60 can be further made of a high reflectivity material with an additive, for example, silicone rubber adding with $TiO_2$. However, the foregoing materials of the reflective structure 60 are only exemplary and not a limitation. Besides, when the reflective structure 60 is able to conduct electricity, there is an insulative structure (not shown in FIG. 18A) between the reflective structure 60 and the LED chip 50. The wavelength conversion structure 80 can be a gum adding with wavelength converting particles like phosphors or quantum dot or a membrane having quantum dots. A yellow-green light, a red light, a blue light, an infrared light or an ultraviolet light can be made by phosphors or quantum dot. The foregoing materials of the wavelength conversion structure 80 are only exemplary and not a limitation.

FIG. 18B shows the top view of the LED package in accordance with the thirteenth embodiment of the present disclosure. FIG. 18B shows that the reflective structure 60 of the LED package I13 encloses the LED chip (not shown in FIG. 18B) and the wavelength conversion 80. In addition, the absorbing structure 70 further encloses the reflective structure 60.

Figure 19:
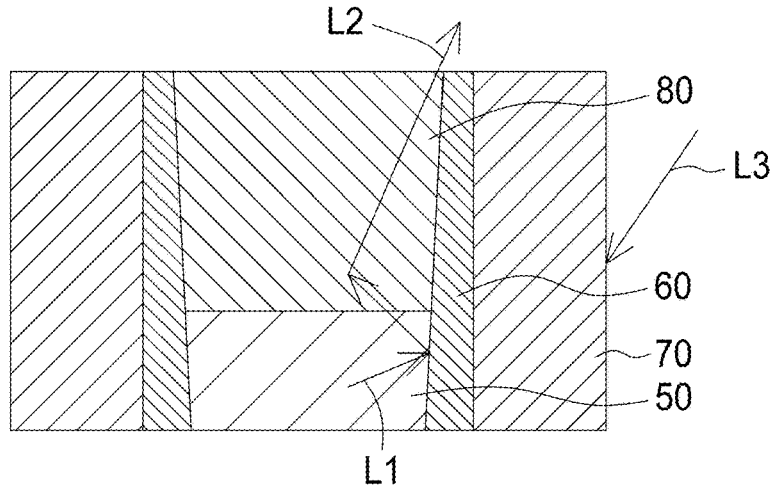
FIG. 19 shows the light path of the light emitted by the LED chip in accordance with a thirteenth embodiment of the present disclosure.

FIG. 19 shows the light path of the light emitted by the LED chip in accordance with the thirteenth embodiment of the present disclosure. FIG. 19 shows that a first light L1 emitted from the LED chip 50 is reflected by the reflective structure 60 to the wavelength conversion structure 80, then part of the first light L1 is absorbed by the wavelength conversion structure 80 so that a second light L2 is converted from the first light L1 and emits. The environmental light L3 which lights into the LED package I13 can be absorbed by the absorbing structure 70. The first light L1 is for example a red light, a green light, or a blue light. The foregoing red light, green light or blue light is only exemplary and not a limitation. The second light L2 is an infrared light in this embodiment.

Figure 20:
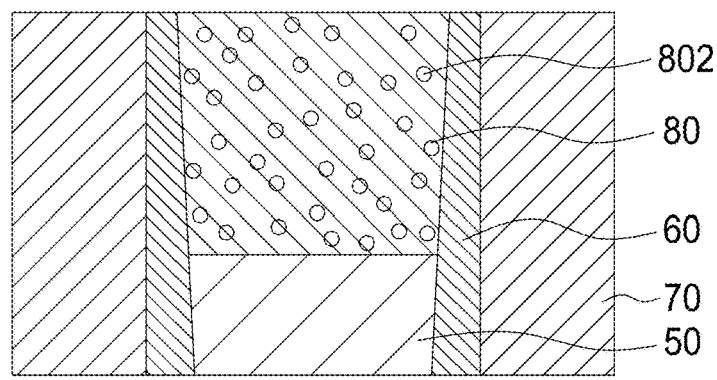
FIG. 20 shows the side view of the LED package in accordance with a fourteenth embodiment of the present disclosure.

FIG. 20 shows the side view of the LED package in accordance with a fourteenth embodiment of the present disclosure. The LED package I14 includes an LED chip 50, a reflective structure 60, an absorbing structure 70 and a wavelength conversion structure 80. The configuration relation among the LED chip 50, the reflective structure 60, the absorbing structure 70 and the wavelength conversion structure 80 of the fourteenth embodiment is the same as that of the as thirteenth embodiment of the present disclosure. However, the wavelength conversion structure 80 of the fourteenth embodiment of the present disclosure further contains a plurality of scattering particles 802, which is different from the thirteenth embodiment of the present disclosure. A part of the first light L1 not absorbed by the wavelength conversion structure 80 remains in the wavelength conversion structure 80 and collides with the scattering particles 802, which results in scattering that increases the probability of being converted by the wavelength converting particles in the wavelength conversion structure 80 to produce the second light L2. Accordingly, the scattering particles 802 increase the probability for producing the second light L2 and further improve the light scattering efficiency of the LED package I14.

Figure 21:
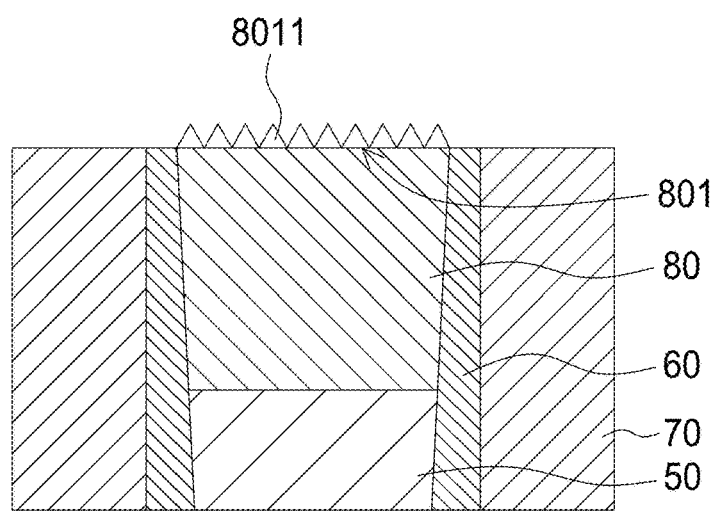
FIG. 21 shows the side view of the LED package in accordance with a fifteenth embodiment of the present disclosure.

FIG. 21 shows the side view of the LED package in accordance with a fifteenth embodiment of the present disclosure. The LED package I15 includes an LED chip 50, a reflective structure 60, an absorbing structure 70, and a wavelength conversion structure 80. The configuration relation among the LED chip 50, the reflective structure 60, the absorbing structure 70 and the wavelength conversion structure 80 of the fifteenth embodiment is the same as that of the thirteenth embodiment of the present disclosure. However, a patterned structure 8011 is set on a top surface 801 of the wavelength conversion structure 80, which is different from the thirteenth embodiment of the present disclosure. The patterned structure 8011 reduces total internal reflection so that light extraction efficiency of the LED package I15 is further improved. The shape of the pattern of the patterned structure 8011 can be cone or pyramid.

Figure 22:
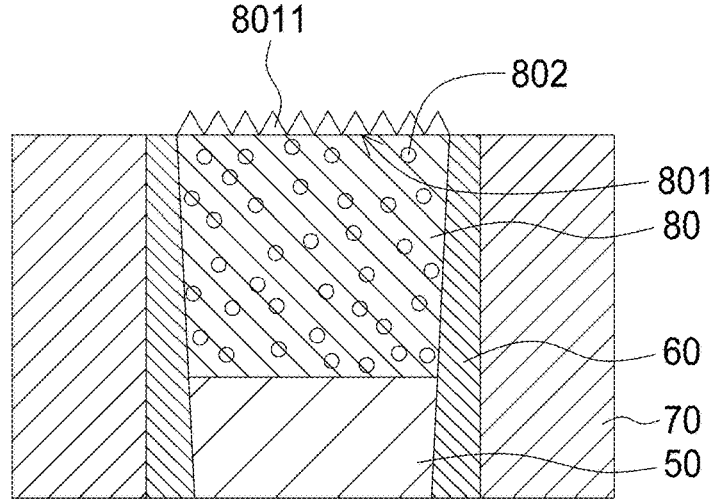
FIG. 22 shows the side view of the LED package in accordance with a sixteenth embodiment of the present disclosure.

FIG. 22 shows the side view of the LED package in accordance with a sixteenth embodiment of the present disclosure. The LED package I16 includes an LED chip 50, a reflective structure 60, an absorbing structure 70 and a wavelength conversion structure 80. The configuration relation among the LED chip 50, the reflective structure 60, the absorbing structure 70 and the wavelength conversion structure 80 is the same as that of the thirteenth embodiment of the present disclosure. However, in the sixteenth embodiment, the wavelength conversion structure 80 of sixteenth embodiment of the present disclosure further contains a plurality of scattering particles 802 and a patterned structure 8011 set on a top surface 801 of the wavelength conversion structure 80. A part of the first light L1 not absorbed by the wavelength conversion structure 80 remains in the wavelength conversion structure 80 and collides with the particles 802, which results in scattering that increases the probability of being converted by the wavelength converting particles in the wavelength conversion structure 80 to produce the second light L2 is further produced form the wavelength conversion structure 80. Accordingly, the scattering particles 802 increase the probability for producing the second light L2 and further improve the light converting efficiency of the LED package I16. In addition, the patterned structure 8011 reduces total internal reflection so that light extraction efficiency of the LED package I16 is further improved.

Figure 23A:
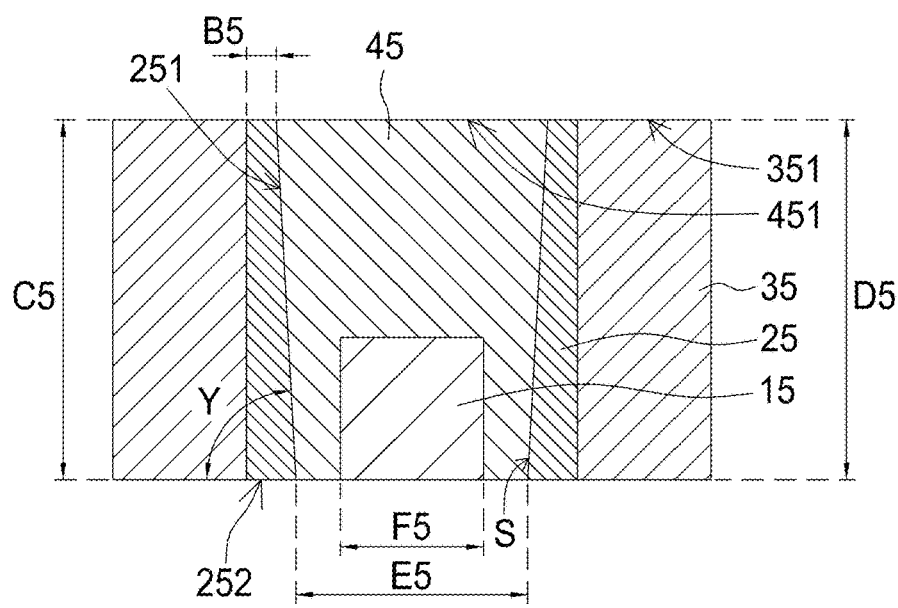
FIG. 23A shows the side view of the LED package in accordance with a seventeenth embodiment of the present disclosure.
Figure 23B:
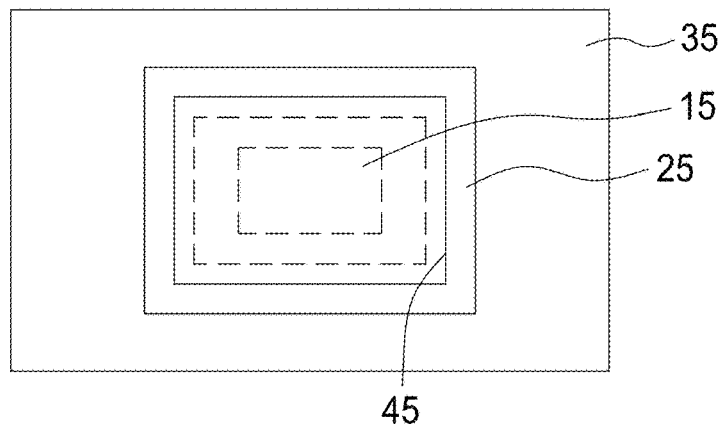
FIG. 23B shows the top view of the LED package in accordance with a seventeenth embodiment of the present disclosure.

FIGS. 23A and 23B show the side view and top view of the LED package in accordance with a seventeenth embodiment of the present disclosure respectively. The LED package I17 includes an LED chip 15, a reflective structure 25, an absorbing structure 35, and a wavelength conversion structure 45.

FIG. 23A shows the side view of the LED package in accordance with the seventeenth embodiment of the present disclosure. The wavelength conversion 45 of the LED package I17 is placed on the LED chip 15. The horizontal width E5 of the wavelength conversion structure 45 declines in a direction from the top to the bottom of the wavelength conversion 45. The bottom horizontal width E5 of the wavelength conversion 45 is larger than the bottom horizontal width F5 of the LED chip 15. The reflective structure 25, the wavelength conversion 40, and an angle Y is formed between an inner surface 251 and a bottom surface 252 of the reflective structure 25. The angle Y is preferably between 60 degrees to 70 degrees. In addition, the absorbing structure 70 further encloses the reflective structure 60. A space S is formed between the reflective structure 25 and the LED chip 15. The top horizontal thickness B5 of the reflective structure 25 can be 50 µm. The longitudinal height C5 of the absorbing structure 35 is equal to the longitudinal height D5 of the reflective structure 25. The top surface 253 of the reflective structure 25, the top surface 351 of the absorbing structure 35, and the top surface 451 of the wavelength conversion structure 45 are almost flush to each other within the manufacturing tolerance. The absorbing structure 35 can be made of graphite powder, for example, flake graphite powder, artificial graphite powder, expanded graphite powder, vermicular graphite powder, amorphous graphite powder or graphite compound. The foregoing materials of the absorbing structure 35 are only exemplary and not a limitation. The reflective structure 25 can be made of a high reflectivity material, for example, silver, $TiO_2$, $ZrO_2$, $Nb_2O_5$, $Al_2O_3$, $SiO_2$, $MgF_2$, or AlN. The reflective structure 25 can be further made of a high reflectivity material with an additive, for example, silicone rubber adding with $TiO_2$. However, the foregoing materials of the reflective structure 25 are only exemplary and not a limitation. The wavelength conversion structure 45 can be a gum adding with wavelength converting particles like phosphors or quantum dot or a membrane having quantum dots. A yellow-green light, a red light, a blue light, an infrared light or an ultraviolet light can be made by phosphors or quantum dot. The foregoing materials of the wavelength conversion structure 80 are only exemplary and not a limitation.

FIG. 23B shows the top view of the LED package in accordance with the seventeenth embodiment of the present disclosure. FIG. 23B shows that the wavelength conversion 45 of the LED package I17 encloses the LED chip (not shown in FIG. 23B) and the reflective structure 25 encloses the wavelength conversion 45. In addition, the absorbing structure 35 further encloses the reflective structure 25.

Figure 24:
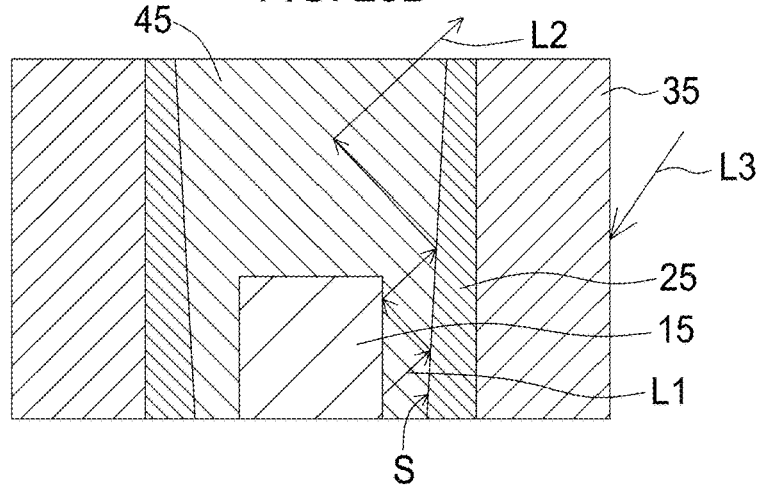
FIG. 24 shows the light path of the light emitted by the LED chip in accordance with the seventeenth embodiment of the present disclosure.

FIG. 24 shows the light path of the light emitted by the LED chip in accordance with the seventeenth embodiment of the present disclosure. FIG. 24 shows that a first light L1 emitted from the LED chip 15 is reflected by the reflective structure 25 to the wavelength conversion structure 45, then part of the first light L1 is absorbed by the wavelength conversion structure 45 so that a second light L2 is converted from the first light L1 and emits. The first light L1 emitted from the LED chip 15 is reflected multiple times in the space S between the reflective structure 25 and the wavelength conversion structure 45 so the second light L2 is converted from the first light L1 and emits. The environmental light L3 which enters into the LED package I17 can be absorbed by the absorbing structure 35. The first light L1 is for example a red light, a green light or a blue light. The foregoing red light, green light or blue light is only exemplary and not a limitation. The second light L2 is an infrared light in this embodiment.

Figure 25:
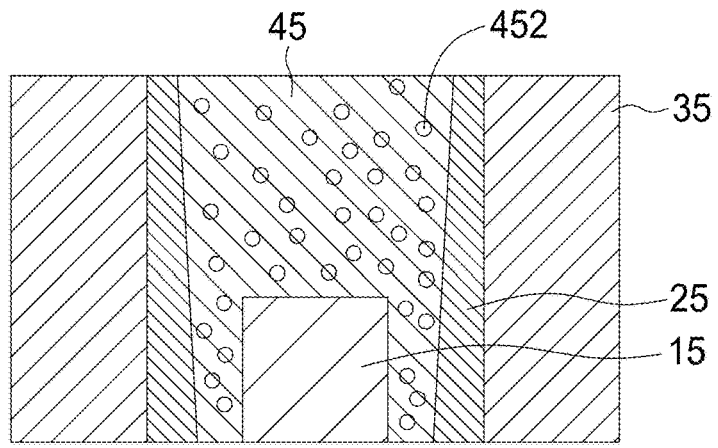
FIG. 25 shows the side view of the LED package in accordance with an eighteenth embodiment of the present disclosure.

FIG. 25 shows the side view of the LED package in accordance with an eighteenth embodiment of the present disclosure. The LED package I18 includes an LED chip 15, a reflective structure 25, an absorbing structure 35 and a wavelength conversion structure 45. The configuration relation among the LED chip 15, the reflective structure 25, the absorbing structure 35, and the wavelength conversion structure 45 of the eighteenth embodiment is the same as that of the seventeenth embodiment of the present disclosure. However, the wavelength conversion structure 45 of the eighteenth embodiment of the present disclosure further contains a plurality of scattering particles 452, which is different from the seventeenth embodiment of the present disclosure. A part of the first light L1 not absorbed by the wavelength conversion structure 45 remains in the wavelength conversion structure 45 and collides with the scattering particles 452, which results in scattering that increases the probability of being converted by the wavelength converting particles in the wavelength conversion structure 40 to produce the second light L2. Accordingly, the scattering particles 452 increase the probability for producing the second light L2 and further improve the light scattering efficiency of the LED package I18.

Figure 26:
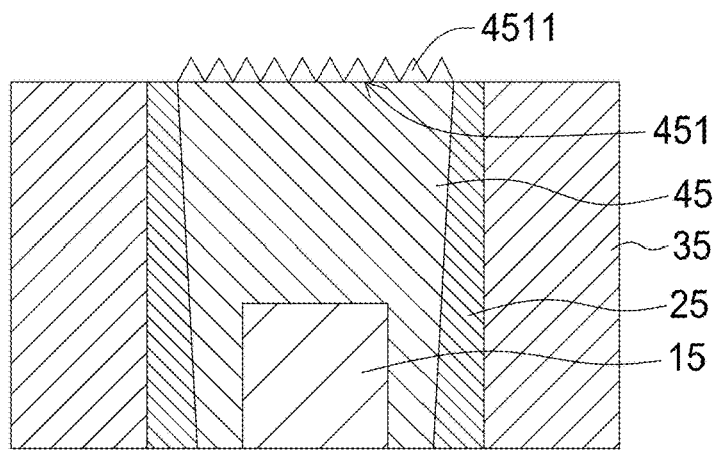
FIG. 26 shows the side view of the LED package in accordance with a nineteenth embodiment of the present disclosure.

FIG. 26 shows the side view of the LED package in accordance with a nineteenth embodiment of the present disclosure. The LED package I19 includes an LED chip 15, a reflective structure 25, an absorbing structure 35 and a wavelength conversion structure 45. The configuration relation among the LED chip 15, the reflective structure 25, the absorbing structure 35 and the wavelength conversion structure 45 of the nineteenth embodiment is the same as that of the seventeenth embodiment of the present disclosure. However, a patterned structure 4511 is set on a top surface 451 of the wavelength conversion structure 45, which is different from the seventeenth embodiment of the present disclosure. The patterned structure 4511 reduces total internal reflection, so that light extraction efficiency of the LED package I19 is further improved. The shape of the pattern of the patterned structure 4511 can be cone or pyramid.

Figure 27:
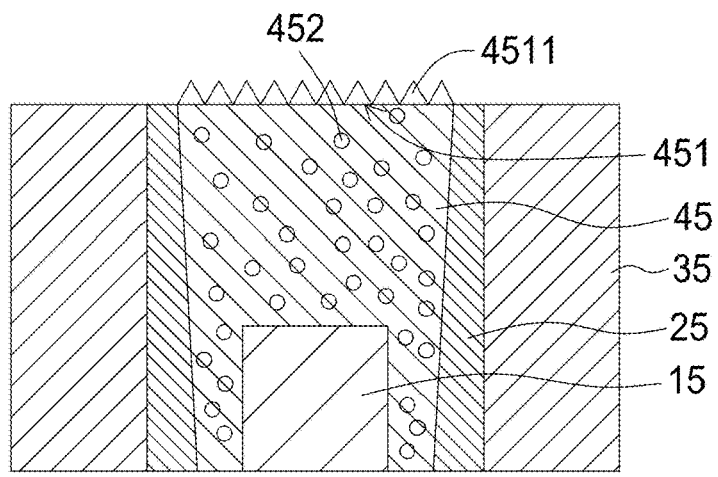
FIG. 27 shows the side view of the LED package in accordance with a twentieth embodiment of the present disclosure.

FIG. 27 shows the side view of the LED package in accordance with a twentieth embodiment of the present disclosure. The LED package I20 includes an LED chip 15, a reflective structure 25, an absorbing structure 35 and a wavelength conversion structure 45. The configuration relation among the LED chip 15, the reflective structure 25, the absorbing structure 35 and the wavelength conversion structure 45 is the same as that of the seventeenth embodiment of the present disclosure. However, in the twentieth embodiment, the wavelength conversion structure 45 of twentieth embodiment of the present disclosure further contains a plurality of scattering particles 452 and a patterned structure 4511 set on a top surface 451 of the wavelength conversion structure 45. A part of the first light L1 not absorbed by the wavelength conversion structure 45 remains in the wavelength conversion structure 45 and collides with the scattering particles 452, which results in scattering that increases the probability of being converted by the wavelength converting particles in the wavelength conversion structure 45 to produce the second light L2. Accordingly, the scattering particles 452 increase the probability for producing the second light L2 and further improve the light converting efficiency of the LED package I20. In addition, the patterned structure 4511 reduces total internal reflection so that light extraction efficiency of the LED Package I20 is further improved.

In the foregoing embodiments, the structure of the LED chip includes a substrate, an n type semiconductor structure set on the substrate, a light-emitting structure set on the n type semiconductor, a p type semiconductor structure set on the light-emitting structure, a current diffusion structure set on the p type semiconductor structure, a p type electrode set on the current diffusion structure; and a n type electrode set on the n type semiconductor structure.

Figure 28:
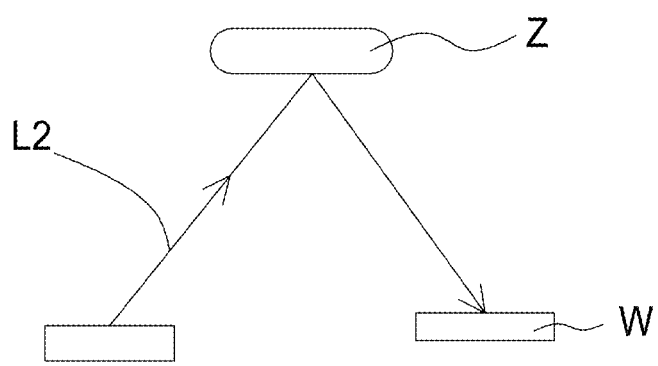
FIG. 28 shows the side view of the sensing device in accordance with another embodiment of the present disclosure.

FIG. 28 shows the side view of the sensing device. The second light L2 enters to the object Z that needs to be detected, then the second light L2 is reflected by the object Z to the sensing detector W. Accordingly, the properties of the object Z can be detected by the sensing detector W. The sensing device 9 is placed within for example the small size apparatus like a mobile phone, an optical mouse, and so on.

In summary, the present disclosure has at least the following advantages:

1. The accuracy of the sensing device is improved:

The LED package of the present disclosure has the reflective structure and the absorbing structure at the same time, so that when the LED package is used as the light source of a sensing device, the absorbing structure can absorb the light back to the wavelength conversion structure caused by the total internal reflection of the wavelength conversion structure, reflection or scattering. In addition, the absorbing structure can also absorb the environmental light so that the secondary light with time difference produced directly or indirectly by the LED package can be absorbed by the absorbing structure. The sensing error caused by the time difference between the secondary light and the first light which incident into the object and sensing device sequentially can be avoided. The interference caused by the environmental light to the sensing device can be avoided too. Accordingly, the accuracy of the sensing device is improved.

2. The light efficiency of the LED package of the present disclosure is enhanced and the location of the object can be detected by the sensing device successfully:

The LED package of the present disclosure has the reflective structure and the absorbing structure at the same time, wherein the absorbing structure has less or even no contact with the LED chip, which results in absorbing less light emitted from the LED chip, such that the brightness of the LED package is increased. The reflective structure further enhances the brightness of the LED package. Accordingly, when the LED package is used as the light source of the sensing device, the brightness of the LED package is increased, therefore the location of the object can be detected by the sensing device successfully.

3. The LED package of the present disclosure can be incorporated in the small size sensing device:

The whole size of the LED package of the present disclosure is within the range 0.4 mm~1.4 mm×0.4 mm~1.4 mm×0.1 mm~0.25 mm. The foregoing size is suitable for applying to the small size sensing device. Accordingly, the LED package of the present disclosure can be used to the small size sensing device effectively.

The present disclosure has been described with some embodiments thereof and it is understood that many changes and modifications in the described embodiments can be carried out without departing from the scope and the spirit of the disclosure that is intended to be limited only by the appended claims.

What is claimed is:

1. An LED package, comprising:
   an LED chip;
   a reflective structure laterally enclosing the LED chip;
   a wavelength conversion structure placed on the LED chip; and
   an absorbing structure arranged between the reflective structure and the wavelength conversion structure, and entirely arranged above the reflective structure.

2. The LED package as claimed in claim 1, wherein the absorbing structure is made of flake graphite powder, artificial graphite powder, expanded graphite powder, vermicular graphite powder, amorphous graphite powder, or graphite compound.

3. The LED package as claimed in claim 1, wherein when the absorbing structure is placed on the reflective structure, a proportion of a first longitudinal height of the absorbing structure to a second longitudinal height of the reflective structure is from 1:3 to 1:10.

4. The LED package as claimed in claim 1, further comprising a patterned structure on the wavelength conversion structure.

5. The LED package as claimed in claim 1, wherein the wavelength conversion structure is entirely placed on the absorbing structure, the reflective structure, and the LED chip.

6. The LED package as claimed in claim 1, wherein the reflective structure and the absorbing structure directly contact the LED chip.

7. An LED package, comprising:
   an LED chip having a bottom horizontal width;
   a reflective structure enclosing the LED chip, and comprising an inner surface, an outer surface opposite to the inner surface, a bottom surface, and an angle formed between the inner surface and the bottom surface;
   an absorbing structure enclosing the reflective structure, and entirely located outside the outer surface; and
   a wavelength conversion structure having a bottom horizontal width, and directly connected to the absorbing structure.

8. The LED package as claimed in claim 7, wherein the absorbing structure is made of flake graphite powder, artificial graphite powder, expanded graphite powder, vermicular graphite powder, amorphous graphite powder, or graphite compound.

9. The LED package as claimed in claim 7, wherein the angle is between 60 degree to 70 degree.

10. The LED package as claimed in claim 7, further comprising a patterned structure on the wavelength conversion structure.

11. The LED package as claimed in claim 7, wherein the bottom horizontal width of the wavelength conversion structure is larger than the bottom horizontal width of the LED chip.

12. The LED package as claimed in claim 7, wherein the reflective structure and the absorbing structure have topmost surfaces which are flush with each other.

13. The LED package as claimed in claim 7, wherein the wavelength conversion structure and the absorbing structure have outermost surfaces which are flush with each other.

14. A sensing device, comprising:
an LED package comprising:
a reflective structure including an inner surface and an outer surface opposite to the inner surface;
an LED chip fully or partially enclosed by the reflective structure;
a wavelength conversion structure placed on the LED chip; and
an absorbing structure entirely arranged above the reflective structure or entirely located outside the outer surface of the reflective structure; and
a sensing detector arranged to receive light emitted from the LED package.

15. The sensing device as claimed in claim 14, wherein the absorbing structure is made of flake graphite powder, artificial graphite powder, expanded graphite powder, vermicular graphite powder, amorphous graphite powder, or graphite compound.

16. The sensing device as claimed in claim 14, wherein the reflective structure comprises:
a bottom surface; and
an angle formed between the inner surface and the bottom surface,
wherein the angle is between 60 degree to 70 degree.

17. The sensing device as claimed in claim 14, wherein the wavelength conversion structure is made of a gum with phosphors or quantum dot, a phosphor, or a membrane having nano particles.

18. The LED package as claimed in claim 14, wherein, if the absorbing structure is entirely arranged above the reflective structure, the reflective structure is lower than the LED chip.

* * * * *